(12) United States Patent
Murphy et al.

(10) Patent No.: US 11,008,509 B2
(45) Date of Patent: May 18, 2021

(54) COATED MANGANESE DOPED PHOSPHORS

(71) Applicant: Current Lighting Solutions, LLC, East Cleveland, OH (US)

(72) Inventors: James Edward Murphy, Niskayuna, NY (US); Florencio Garcia, Schenectady, NY (US)

(73) Assignee: CURRENT LIGHTING SOLUTIONS, LLC, East Cleveland, OH (US)

( * ) Notice: Subject to any disclaimer, the term of this patent is extended or adjusted under 35 U.S.C. 154(b) by 96 days.

(21) Appl. No.: 16/306,309

(22) PCT Filed: Jun. 27, 2017

(86) PCT No.: PCT/US2017/039439
§ 371 (c)(1),
(2) Date: Nov. 30, 2018

(87) PCT Pub. No.: WO2018/005448
PCT Pub. Date: Jan. 4, 2018

(65) Prior Publication Data
US 2019/0136128 A1    May 9, 2019

Related U.S. Application Data

(60) Provisional application No. 62/354,860, filed on Jun. 27, 2016.

(51) Int. Cl.
*H01L 33/50* (2010.01)
*C09K 11/02* (2006.01)
(Continued)

(52) U.S. Cl.
CPC ......... *C09K 11/025* (2013.01); *C09K 11/616* (2013.01); *C09K 11/617* (2013.01);
(Continued)

(58) Field of Classification Search
None
See application file for complete search history.

(56) References Cited

U.S. PATENT DOCUMENTS

| | | | |
|---|---|---|---|
| 6,193,908 B1 * | 2/2001 | Hampden-Smith | B01J 2/003 252/301.35 |
| 8,163,336 B2 | 4/2012 | Weimer et al. | |

(Continued)

FOREIGN PATENT DOCUMENTS

| | | |
|---|---|---|
| CA | 1277551 C | 12/1990 |
| CN | 102827601 A | 12/2012 |

(Continued)

OTHER PUBLICATIONS

International Search Report and Written Opinion for the corresponding PCT/US2017/039439 dated Sep. 13, 2017; 12 pages.

(Continued)

*Primary Examiner* — Ali Naraghi
(74) *Attorney, Agent, or Firm* — Buckley, Maschoff & Talwalkar LLC

(57) ABSTRACT

A population of coated phosphor particles is presented. Each coated phosphor particle has a core including a $Mn^{4+}$ doped phosphor and a shell including aluminum oxide, titanium oxide, zirconium oxide, zinc oxide, tin oxide, silicon dioxide, hafnium oxide, indium oxide, indium tin oxide, potassium fluoride, titanium nitride, boron nitride, silicon nitride, a polymer material, or a combination thereof. A process for preparing the population of coated phosphor particles is also presented.

13 Claims, 1 Drawing Sheet

(51) Int. Cl.
   *C09K 11/61*   (2006.01)
   *H01L 33/48*   (2010.01)
   *H01L 33/62*   (2010.01)

(52) U.S. Cl.
   CPC .......... *H01L 33/502* (2013.01); *H01L 33/505* (2013.01); *H01L 33/486* (2013.01); *H01L 33/62* (2013.01)

(56) References Cited

U.S. PATENT DOCUMENTS

| | | | |
|---|---|---|---|
| 8,980,661 B2 | 3/2015 | Ichikawa et al. | |
| 2006/0234417 A1 | 10/2006 | Isobe et al. | |
| 2007/0172580 A1* | 7/2007 | Fan .................. | C09K 11/584 427/66 |
| 2012/0276305 A1 | 11/2012 | Hamalainen et al. | |
| 2012/0286701 A1 | 11/2012 | Yang et al. | |
| 2012/0305972 A1 | 12/2012 | Meyer et al. | |
| 2015/0048399 A1 | 2/2015 | Weiler et al. | |
| 2015/0076406 A1 | 3/2015 | Zhou et al. | |
| 2016/0160122 A1* | 6/2016 | You .................. | C09K 11/025 428/403 |

FOREIGN PATENT DOCUMENTS

| | | |
|---|---|---|
| WO | 9110715 A1 | 7/1991 |
| WO | 2012015581 A1 | 2/2012 |
| WO | 2014104143 A1 | 7/2014 |
| WO | 2015102876 A1 | 7/2015 |
| WO | 2016014392 A1 | 1/2016 |

OTHER PUBLICATIONS

Steven M George, "Atomic Layer Deposition: An Overview", American Chemical Society, Chem. Rev. , vol. 110, Issue: 1, 2010, pp. 111-131.
Rauwel et al., "ALD Applied to Conformal Coating of Nanoporous γ-Alumina: Spinel Formation and Luminescence Induced by Europium Doping", Journal of the Electrochemical Society, vol. 159, issue: 4, 2012 , p. 45-p. 49.
Goulas et al., "Scalable Production of Nanostructured Particles using Atomic Layer Deposition", KONA Powder and Particle Journal, vol. 31, 2014, pp. 234-246.
Written Opinion of the International Searching Authority from corresponding International Application No. PCT/JP2015/055382 dated May 19, 2015, 6 Pages.
Porob et al.,"Coated Red Line Emitting Phosphors",Pending US Patent Application Sr. No. 201641039267; Filing Date:Nov. 17, 2016, 35 Pages.

* cited by examiner ered, luminous efficacy is maximized compared to red phosphors that have significant emission in the deeper red where eye sensitivity is poor. Quantum efficiency can exceed to 85% under blue (440-460 nm) excitation.
COATED MANGANESE DOPED PHOSPHORS This application is a filing under 35 U.S.C. 371 of international application number PCT/US2017/039439, filed Jun. 27, 2017, which claims priority to U.S. provisional application No. 62/354,860, filed Jun. 27, 2016, the entire disclosure of each of which is hereby incorporated by reference.

CROSS-REFERENCE TO RELATED APPLICATIONS

This application is a non-provisonal of, and claims priority from U.S. provisional application, Ser. No. 62/354,860, filed on Jun. 27, 2016, the entire disclosure of which is hereby incorporated by reference.

BACKGROUND OF THE INVENTION

Red-emitting phosphors based on complex fluoride materials activated by manganese ($Mn^{4+}$), such as those described in U.S. Pat. Nos. 7,358,542, 7,497,973, and 7,648,649, can be utilized in combination with yellow/green emitting phosphors such as YAG:Ce or other garnet compositions to achieve warm white light (CCTs<5000 K on the blackbody locus, color rendering index (CRI>80) from a blue LED, equivalent to that produced by current fluorescent, incandescent and halogen lamps. These materials absorb blue light strongly and efficiently emit between about 610-635 nanometers (nm) with little deep red/NIR emission. Therefore, luminous efficacy is maximized compared to red phosphors that have significant emission in the deeper red where eye sensitivity is poor. Quantum efficiency can exceed to 85% under blue (440-460 nm) excitation.

While the efficacy and CRI of lighting systems using manganese doped red-emitting phosphors can be quite high, the potential limitations may be color instability and non-uniformity due to their susceptibility to degradation under high temperature and/or high humidity conditions. It may be possible to reduce the color instability issue of the manganese doped red-emitting phosphors using post-synthesis processing steps as described in U.S. Pat. No. 8,906,724. However, development of manganese doped red-emitting phosphors with improved stablity is desirable.

BRIEF DESCRIPTION OF THE INVENTION

Briefly, in one aspect, a population of coated phosphor particles is provided. Each coated phosphor particle has a core including a $Mn^{4+}$ doped phosphor and a shell including aluminum oxide, titanium oxide, zirconium oxide, zinc oxide, tin oxide, silicon dioxide, hafnium oxide, indium oxide, indium tin oxide, potassium fluoride, titanium nitride, boron nitride, silicon nitride, a polymer material, or a combination thereof.

In one aspect, a lighting apparatus includes a semiconductor light source radiationally coupled to the population of coated phosphor particles. In one aspect, a backlight apparatus includes a semiconductor light source radiationally coupled to the population of coated phosphor particles.

In one aspect, a process for preparing a population of coated phosphor particles includes exposing particles of a $Mn^{4+}$ doped phosphor alternately to a first precursor and a second precursor to form a coating on each particle. The coating includes aluminum oxide, titanium oxide, zirconium oxide, zinc oxide, tin oxide, silicon dioxide, hafnium oxide, indium oxide, indium tin oxide, potassium fluoride, titanium nitride, boron nitride, silicon nitride, a polymer material, or a combination thereof.

BRIEF DESCRIPTION OF THE DRAWINGS

These and other features, aspects, and advantages of the present disclosure will become better understood when the following detailed description is read with reference to the accompanying drawings, wherein.

DETAILED DESCRIPTION OF THE INVENTION

Figure 1:
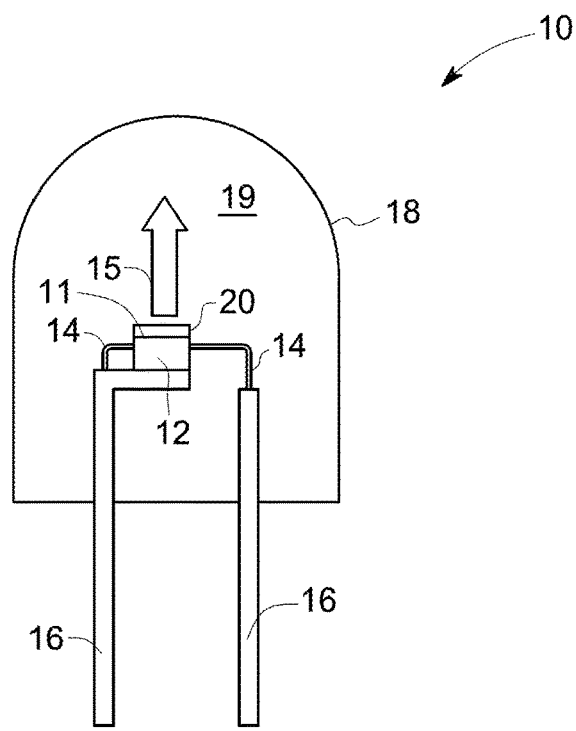
FIG. 1 is a schematic cross-sectional view of a lighting apparatus, in accordance with one embodiment of the present disclosure.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, or 20 to 80, it is intended that values such as 15 to 85, 22 to 68, 43 to 51, 30 to 32 etc. are expressly enumerated in this specification. For values, which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Some embodiments are directed to a population of coated phosphor particles. Each coated phosphor particle has a core including a $Mn^{4+}$ doped phosphor and a shell including aluminum oxide, titanium oxide, zirconium oxide, zinc oxide, tin oxide, silicon dioxide, hafnium oxide, indium oxide, indium tin oxide, potassium fluoride, titanium nitride, boron nitride, silicon nitride, a polymer material or a combination thereof. In some embodiments, the population of coated phosphor particles may be prepared by the process as described herein below.

In some embodiments, the $Mn^{4+}$ doped phosphor is a compound of formula I, $$A_x(M, Mn)F_y \qquad (I)$$

wherein

A is Li, Na, K, Rb, Cs, or a combination thereof;

M is Si, Ge, Sn, Ti, Zr, Al, Ga, In, Sc, Hf, Y, La, Nb, Ta, Bi, Gd, or a combination thereof;

x is an absolute value of a charge of an [$MF_y$] ion; and y is 5, 6, or 7

The compound of formula I is a manganese ($Mn^{4+}$) doped complex fluoride. The compound of formula I is a phosphor that emits red light, and may also be referred to as 'red-emitting' phosphor, and these terms are used interchangeably throughout the specification. Complex fluorides have a host lattice containing one coordination center surrounded by fluoride ions acting as ligands, and charge-compensated by counter ions (A) as required. For example, in $K_2[SiF_6]$, the coordination center is Si and the counter ion is K. Complex fluorides are generally represented as a combination of simple, binary fluorides. The square brackets in the chemical formula for the complex fluorides (occasionally omitted for simplicity) indicate that the complex ion present in that particular complex fluoride is a new chemical species, different from the simple fluoride ion. In the compound of formula I, the $Mn^{4+}$ dopant or activator acts as an additional coordination center, substituting a part of the coordination center, for example, Si, forming a luminescent center. The manganese doped compound of formula I: $A_2[(M, Mn)F_6]$ may also be represented as $A_2[MF_6]:Mn^{4+}$. The host lattice (including the counter ions) may further modify the excitation and emission properties of the activator ion.

The counter ion A in formula I is Li, Na, K, Rb, Cs, or a combination thereof. In certain embodiments, A is Na, K, or a combination thereof. The coordination center M in formula I is Si, Ge, Ti, Zr, Hf, Sn, Al, Ga, In, Sc, Y, Bi, La, Gd, Nb, Ta, or a combination thereof. In some embodiments, M is Si, Ge, Ti, or a combination thereof. In certain embodiments, A is K, and M is Si. Examples of the compounds of formula I include $K_2[SiF_6]:Mn^{4+}$, $K_2[TiF_6]:Mn^{4+}$, $K_2[SnF_6]:Mn^{4+}$, $Cs_2[TiF_6]:Mn^{4+}$, $Rb_2[TiF_6]:Mn^{4+}$, $Cs_2[SiF_6]:Mn^{4+}$, $Rb_2[SiF_6]:Mn^{4+}$, $Na_2[TiF_6]:Mn^{4+}$, $Na_2[ZrF_6]:Mn^{4+}$, $K_3[ZrF_7]:Mn^{4+}$, $K_3[BiF_7]:Mn^{4+}$, $K_3[YF_7]:Mn^{4+}$, $K_3[LaF_7]:Mn^{4+}$, $K_3[GdF_7]:Mn^{4+}$, $K_3[NbF_7]:Mn^{4+}$ or $K_3[TaF_7]:Mn^{4+}$. In certain embodiments, the phosphor of formula I is $K_2[SiF_6]:Mn^{4+}$.

In some embodiments, the $Mn^{4+}$ doped phosphor that may be used as the cores of the coated phosphor particles as described herein, is:

(A) $A_2[MF_5]:Mn^{4+}$, where A is selected from Li, Na, K, Rb, Cs, and combinations thereof; and where M is selected from Al, Ga, In, and combinations thereof;

(B) $A_3[MF_6]:Mn^{4+}$, where A is selected from Li, Na, K, Rb, Cs, and combinations thereof; and where M is selected from Al, Ga, In, and combinations thereof;

(C) $Zn_2[MF_7]:Mn^{4+}$, where M is selected from Al, Ga, In, and combinations thereof;

(D) $A[In_2F_7]:Mn^{4+}$ where A is selected from Li, Na, K, Rb, Cs, and combinations thereof;

(E) $E[MF_6]:Mn^{4+}$, where E is selected from Mg, Ca, Sr, Ba, Zn, and combinations thereof; and where M is selected from Ge, Si, Sn, Ti, Zr, and combinations thereof;

(F) $Ba_{0.065}Zr_{0.35}F_{2-70}:Mn^{4+}$; and (G) $A_3[ZrF_7]:Mn^{4+}$ where A is selected from Li, Na, K, Rb, Cs, and combinations thereof.

In some embodiments, the $Mn^{4+}$ doped phosphor may be a compound of formula II, III, IV, or V $$A_aB_bC_cD_dX_x:Mn^{4+} \qquad (II)$$

$$A_{ai}B_{bi}C_{ci}D_dX_xY_d:Mn^{4+} \qquad (III)$$

$$A^1{}_3G_{2-m-n}Mn_mMg_nLi_3F_{12}O_p \qquad (IV)$$

$$AZF_4:Mn^{4+} \qquad (V)$$

wherein

A is Li, Na, K, Rb, Cs, or a combination thereof;

B is Be, Mg, Ca, Sr, Ba, or a combination thereof;

C is Sc, Y, B, Al, Ga, In, Tl, or a combination thereof;

D is Ti, Zr, Hf, Rf, Si, Ge, Sn, Pb, or a combination thereof;

X is F or a combination of F and at least one of Br, Cl, and I;

Y is O, or a combination of O and at least one of S and Se;

Al is Na or K, or a combination thereof;

G is Al, B, Sc, Fe, Cr, Ti, In, or a combination thereof;

Z is La, Ce, Pr, Nd, Pm, Sm, Eu, Gd, Tb, Dy, Ho, Er, Tm, Yb, Lu, Sc, Y, In, or a combination thereof;

$0 \leq a < 2$;

$0 \leq b < 1$;

$0 \leq c < 1$;

$0 \leq d \leq 1$;

$0.8 \leq ai \leq 1.2$;

$0.8 \leq bi \leq 1.2$;

$0 \leq ciii \leq 1.2$;

$5.0 \leq x \leq 7$;

$0.8 \leq c+d \leq 1.2$;

$a+2b+3c+4d=x$;

$0.8 \leq ci+d \leq 1$;

$5.0 \leq x+d \leq 7.0$;

$ai+2bi+3ci+4d=x+2d$;

$0.02 \leq m \leq 0.2$;

$0 \leq n \leq 0.4$; and $0 \leq p < 1$.

The compounds of formula II are described in WO 2014/104143, assigned to Mitsubishi Chemical Corporation, $$A_aB_bC_cD_dX_x:Mn^{4+} \qquad (II)$$

wherein

A is Li, Na, K, Rb, Cs, or a combination thereof;

B is Be, Mg, Ca, Sr, Ba, or a combination thereof;

C is Sc, Y, B, Al, Ga, In, Tl, or a combination thereof;

D is Ti, Zr, Hf, Rf, Si, Ge, Sn, Pb, or a combination thereof;

X is F or a combination of F and at least one of Br, Cl, and I;

$0 \leq a < 2$;

$0 \leq b < 1$;

$0 \leq c < 1$;

$0 \leq d \leq 1$;

$0.8 \leq c+d \leq 1.2$;

$5.0 \leq x \leq 7$; and $a+2b+3c+4d=x$

Examples of the compounds of formula II include, but are not limited to, compounds of formula $NaBaAlF_6:Mn^{4+}$, $K_2SrAlF_6:Mn^{4+}$, and $Na_2SrGaF_6:Mn^{4+}$. Additional examples and preparation of the compounds are disclosed in WO 2014/104143.

The compounds of formula III are also described in WO 2014/104143, $$A_{ai}B_{bi}C_{ci}D_dX_xY_d:Mn^{4+} \qquad (III)$$

wherein
Y is O, or a combination of O and at least one of S and Se;
$0.8 \leq ai \leq 1.2$
$0.8 \leq bi \leq 1.2$
$0 \leq ci \leq 1.2$
$0.8 \leq ci+d \leq 1.2$
$5.0 \leq +d \leq 7.0$;
$ai+2bi+3ci+4d=x+2d$; and
Y is O, or a combination of O and at least one of S and Se.

Examples of the compounds of formula III include, but are not limited to, compounds of formula $NaBaTiF_5O$ and $KCaAl_{0.5}Ti_{0.5}F_{5.5}O_{0.5}$. Additional examples and preparation of the compounds are disclosed in WO 2014/104143.

The compounds of formula II and III are described in WO 2014/104143 as having improved water resistance and reduced deterioration over time. However, annealing the materials according to the processes of the present disclosure may improve properties such as water resistance and long term stability even further.

The compounds of formula IV are described in US 2012/0305972, assigned to Koninklijke Philips Electronics N.V.,

$$A^1{}_3G_{2-m-n}Mn_mMg_nLi_3F_{12}O_p, \quad (IV)$$

wherein
$A^1$ is Na or K, or a combination thereof;
G is Al, B, Sc, Fe, Cr, Ti, In, or a combination thereof;
$0.02 \leq m \leq 0.2$;
$0 \leq n \leq 0.4$; and
$0 \leq p < 1$.

An example of a compound of formula IV is $Na_3Al_{1.94}Mn_{0.3}Mg_{0.03}Li_3F_{12}$. Preparation of the compounds of formula IV is disclosed in US 2012/0305972.

The compounds of formula V are described in CN 102827601, assigned to Fujian Institute of Structure of Matter,

$$AZF_4:Mn^{4+} \quad (V)$$

wherein
Z is La, Ce, Pr, Nd, Pm, Sm, Eu, Gd, Tb, Dy, Ho, Er, Tm, Yb, Lu, Sc, Y, In, or a combination thereof.

An example of a compound of formula V is $NaYF_4:Mn^{4+}$. Preparation of the compounds of formula V is disclosed in CN 102827601.

The amount of manganese in the $Mn^{4+}$ doped phosphor may range from about 0.3 weight percent (wt %) to about 4 wt %, (from about 1.2 mole percent (mol %) to about 16.5 mol %), based on a total weight of the $Mn^{4+}$ doped phosphor. In some embodiments, the amount of manganese ranges from about 0.50 wt % to about 3.3 wt % (from about 2 mol % to about 13.4 mol %), and in certain embodiments, from about 0.65 wt % to about 3.0 wt % (from about 2.6 mol % to about 12.2 mol %). In some embodiments, the amount of manganese ranges from about 0.75 wt % to about 2.76 wt % (about 3 mol % to about 11.2 mol %). In some embodiments, the amount of manganese ranges from about 0.9 wt % to about 2.5 wt % (from about 3.5 mol % to about 10 mol %), and in certain embodiments, from about 0.9 wt % to about 1.4 wt % (about 3.5 mol % to about 5.5 mol %).

The shell may be a coating disposed on the core. In some embodiments, the shell is a conformal coating. As used herein, the term "conformal coating" refers to a coating which 'conforms' to the surface of the core. Further, the coating may be disposed uniformly on the core. That is, the coating is covering substantially entire surface of the core. In some embodiments, the coating is covering more than 90 percent of the entire surface of the core. In some embodiments, the shell or the coating does not absorb more than 10 percent excitation or emission radiation.

The shell may be a protective coating that protects the core including the $Mn^{4+}$ doped phosphor from degradation. The coated phosphor particles have a stability higher than that of the particles of the $Mn^{4+}$ doped phosphor i.e., uncoated particles of the phosphor. Stability of phosphor particles (coated or uncoated) may refer to stability of the phosphor particles in a high temperature and high humidity environment. Generally, stability of a phosphor material may be analyzed by measuring a change in quantum efficiency of the phosphor material after exposing the phosphor material to the high temperature and high humidity environment. As used herein, the term "high temperature and high humidity environment (HTHH)" refers to an environment having at least 50 percent relative humidity (with respect to an environment having no humidity) and at least 50 degrees' Celsius temperature. In some embodiments, the HTHH environment has at least 60 percent relative humidity and 60 degrees' Celsius temperature. In some embodiments, the HTHH environment has at least 85 percent relative humidity and 85 degrees' Celsius temperature. In some embodiments, the HTHH environment has about 90 percent relative humidity and 60 degrees' Celsius temperature. In some embodiments, a change in quantum efficiencies after exposing the coated phosphor particles is lower than that of a change in quantum efficiencies of the particles (uncoated) of the $Mn^{4+}$ doped phosphor. The coated phosphor particles may have a stability higher than the stability of particles of the $Mn^{4+}$ doped phosphor in the high temperature and high humidity environment.

In some embodiments, the shell includes a metal oxide selected from aluminum oxide, titanium oxide, zirconium oxide, zinc oxide, tin oxide, silicon dioxide, hafnium oxide, indium oxide, indium tin oxide and combinations thereof. In a particular embodiment, the shell includes aluminum oxide. In some embodiments, the shell is free of manganese. In some other embodiments, the shell includes a polymer material. Examples of the polymer materials include polyethylene, polyacrylate, polyamide, and polyimide.

The shell may have a thickness less than half of a wavelength of an excitation radiation (that may range from about 400 nanometers to about 500 nanometers). In some embodiments, the shell has a thickness less than 200 nanometers. In some embodiments, the shell has a thickness in a range from about 1 nanometer to about 150 nanometers. In some embodiments, the shell has a thickness in a range from about 2 nanometers to about 100 nanometers The population of coated phosphor particles may have a particle size distribution having a D50 particle size in a range from about 0.1 micron to about 80 microns. In some embodiments, the coated phosphor particles have a particle size distribution having a D50 particle size in a range from about 1 micron to about 50 microns. In some embodiments, a D50 particle size of the coated phosphor particles is sub-micron size.

Some embodiments are directed to a process for preparing a population of coated phosphor particles. In some embodiments, the process for preparing the population of coated phosphor particles include atomic layer deposition (ALD) process. In a typical ALD process, doses of the reactant vapors are supplied alternately to a surface to produce a desirable deposit. Various suitable inorganic or organic precursors may be used as one of the reactant vapor. The other reactant vapor typically includes hydrogen gas, ammonia gas, or water vapor. For example, when one reactant vapor includes metal and other reactant vapor includes water vapor, a metal oxide coating is deposited.

Any suitable ALD reactor may be used to perform the ALD process. In some embodiments, the reactor is a fluidized bed reactor or rotary reactor. ALD processes are described in an article entitled "Atomic Layer Deposition: An Overview" by Steven M. George, Chemical Review 2010, Vol. 110, Pages 111-131.

In some embodiments, the process for preparing the population of coated phosphor particles includes exposing particles of the $Mn^{4+}$ doped phosphor alternately to a first precursor and a second precursor to form a coating on each particle. In some embodiments, the process includes expositing the particles alternately to vapors of the first precursor and the second precursor. The coating may include aluminum oxide, titanium oxide, zirconium oxide, zinc oxide, tin oxide, silicon dioxide, hafnium oxide, indium oxide, indium tin oxide, potassium fluoride, titanium nitride, boron nitride, silicon nitride, a polymer material, or a combination thereof.

For coatings such as aluminum oxide, titanium oxide, zirconium oxide, zinc oxide, tin oxide, silicon dioxide, hafnium oxide, indium oxide, indium tin oxide, potassium fluoride, titanium nitride, boron nitride, silicon nitride, the first precursor may include a metal selected from aluminum, titanium, tin, zirconium, zinc, silicon, hafnium, indium, boron, potassium, magnesium, calcium and combinations thereof. The first precursor may be a metal halide such as metal tetrachloride, metal oxide, elemental metal, metal hydroxide, metal nitrate, metal acetate, organometallic compound or a combination thereof. The organometallic compound may include diethyl metal, triethyl metal, metallocene $(M(C_5H_5)_2)$, or $(CH_3C_5H_4)M(CH_3)_3$, where M is the metal as discussed above. Suitable examples of the first precursors include dichlorosilane $(SiH_2Cl_2)$, silicon tetrachloride $(SiCl_4)$, titanium tetrachloride $(TiCl_4)$, trimethylaluminum (TMA), triethylzinc, or titanium isopropoxide $(Ti(OiPr)_4)$. Additionally, catalysts such as lewis bases such as $NH_3$ or pyridine in combination with a silicon containing precursor such as tetraethoxysilane (TEOS) or $SiCl_4$ may be used. Catalysts enable higher reaction rates at a given temperature, enabling the ALD process to occur at a temperature that does not degrade the phosphor.

The second precursor may include the vapor including oxygen, nitrogen, fluoride, or a combination thereof. The second precursor may include water, ozone, ammonia, fluorine, or a combination thereof. In a particular embodiment, the second vapor is water vapor. In another particular embodiment, the precursor for the second vapor is ozone.

For coatings that include a polymer coating, the first precursor and the second precursor may include organic precursors. In some embodiments, the first precursor includes an alkyl chloride and the second precursor includes an alkylamine. Moreover, in some embodiments, the first precursor may include a metal compound as discussed above and the second precursor may include an organic precursor to deposit a hybrid inorganic-organic polymer coating on the particles of the $Mn^{4+}$ doped phosphor. In some embodiments, the organic precursor may be an organic diol for example, ethylene glycol.

As noted, the process includes exposing particles of the $Mn^{4+}$ doped phosphor alternately to the first vapor and the second vapor. The step of exposing the particles of the $Mn^{4+}$ doped phosphor may be carried out at a temperature lower than 300 degrees Celsius. In some embodiments, the step of exposing the particles of the $Mn^{4+}$ doped phosphor may be carried out at a temperature lower than 200 degrees Celsius, and in some embodiments, lower than 150 degrees Celsius. In some embodiments, the temperature may vary in a range from about 25 degrees Celsius to about 120 degrees Celsius. In some embodiments, the temperature may vary in a range from about 30 degrees Celsius to about 100 degrees Celsius.

As the process proceeds, the process produces conformal deposition on the particles of the $Mn^{4+}$ doped phosphor, and thereby forms coated phosphor particles of the $Mn^{4+}$ doped phosphor. The conformal deposition forms a conformal coating (i.e., the shell) on each particle (i.e., the core) of the $Mn^{4+}$ doped phosphor. In some embodiments, the coated phosphor particles of the $Mn^{4+}$ doped phosphor are obtained in powder form.

The thickness of the coating or the shell may depend on various process parameters, for example, one or more of the amounts of the reactant vapors (e.g., the first vapor and the second vapor) to which the particles of the $Mn^{4+}$ doped phosphor are exposed, the exposure time and temperature, and may be controlled by tailoring these parameters. The thickness of the shell is described previously.

In some embodiments, the particles of the $Mn^{4+}$ doped phosphor are treated to enhance performance and stability (quantum efficiency, thermal stability, humidity stability, flux stability, and color stability) prior to perform the process for preparing the coated phosphor particles. In these instances, the particles of the $Mn^{4+}$ doped phosphor is contacted with a fluorine-containing oxidizing agent in gaseous form at an elevated temperature. The treatment process is described in U.S. Pat. No. 8,906,724.

Some embodiments are directed to a lighting apparatus that includes a semiconductor light source radiationally coupled to a population of the coated phosphor particles as described herein. Each coated phosphor particle of the population has a core including the $Mn^{4+}$ doped phosphor and a shell including aluminum oxide, titanium oxide, zirconium oxide, zinc oxide, tin oxide, silicon dioxide, hafnium oxide, indium oxide, indium tin oxide, potassium fluoride, titanium nitride, boron nitride, silicon nitride, polyethylene, polyacrylate, or a combination thereof. In one embodiment, the semiconductor light source can be a light emitting diode (LED) light source. Radiationally coupled means that radiation from the semiconductor light source is transmitted to the population of the coated phosphor particles, and the coated phosphor particles emit radiation of a different wavelength. A combination of radiation from the semiconductor light source and radiation emitted from the population of the coated phosphor particles may be used to produce a desired color emission or white light. For example, a light emitting LED device may be based on a blue emitting InGaN LED chip. The blue emitting LED chip may include a layer including a population of the coated phosphor particles to convert some of the blue radiation to a complementary color, e.g. a red emission or a white emission.

FIG. 1 illustrates a lighting apparatus 10, for example a lamp, in accordance with some embodiments. The lighting apparatus 10 includes a light emitting diode (LED) chip 12, and leads 14 electrically attached to the LED chip 12. The leads 14 may comprise thin wires supported by a thicker lead frame(s) 16 or the leads 14 may comprise self supported electrodes and the lead frame may be omitted. The leads 14 provide current to LED chip 12 and thus cause it to emit radiation. The LED chip 12 may be based on a semiconductor, for example a semiconductor of formula $In_iGa_jAl_kN$ (where $0 \leq i$; $0 \leq j$; $0 \leq k$ and $i+j+k=1$) having an emission wavelength greater than about 250 nanometers and less than about 550 nanometers. In certain embodiments, the LED chip 12 may be a blue emitting LED chip having a peak emission wavelength from about 400 nanometers to about 500 nanometers. In the lighting apparatus 10, a phosphor composition 20 including a population of the coated phosphor particles (as described herein above in some embodiments) is disposed on a surface 11 of the LED chip 12, and is radiationally coupled to the LED chip 12. The phosphor composition 20 can be deposited on the surface 11 of the LED chip 12 by any appropriate method, for example using a slurry prepared mixing silicone and the population of the coated phosphor particles. The light emitted by the LED chip 12 mixes with the light emitted by the population of coated phosphor particles to produce desired emission (indicated by arrow 15).

Although the general discussion of the example structure of the lighting apparatus discussed herein is directed toward inorganic LED based light sources, it should be understood that the LED chip may be replaced by an organic light emissive structure or other radiation source, unless otherwise noted, and that any reference to an LED chip or semiconductor is merely representative of any appropriate radiation source.

With continued reference to FIG. 1, the LED chip 12 may be encapsulated within an envelope 18, which encloses the LED chip 12 and an encapsulant material (not shown in FIG. 1) disposed in a portion 19 of the lighting apparatus 10. The envelope 18 may be formed of, for example, glass or plastic. The LED chip 12 may be enclosed by the encapsulant material. The encapsulant material may be a low temperature glass, or a polymer or resin known in the art, for example, an epoxy, silicone, epoxy-silicone, acrylate or a combination thereof. In an alternative embodiment, the lighting apparatus 10 may only include the encapsulant material without the outer envelope 18.

In some embodiments, a population of the coated phosphor particles may be interspersed within the encapsulant material, instead of being disposed on the LED chip 12 (referring to FIG. 1). In some other embodiments, the phosphor composition that includes the coated phosphor particles, may be coated onto a surface of the envelope 18, instead of being disposed on the LED chip 12. Moreover, in some embodiments, the lighting apparatus 10 may include a plurality of LED chips (not shown in figures). These various configurations may be combined, with the phosphor composition located in any two or more locations or in any other suitable location, such as separately from the envelop 18 or integrated into the LED chip 12. Further, one or more additional luminescent materials (described below) such as phosphors or mixtures of phosphors or other materials, may be used in the phosphor composition or different parts of the lighting apparatus 10, for example disposed on or below or in the phosphor composition 20 (FIG. 1) or any other location in the lighting apparatus 10.

Figure 2:
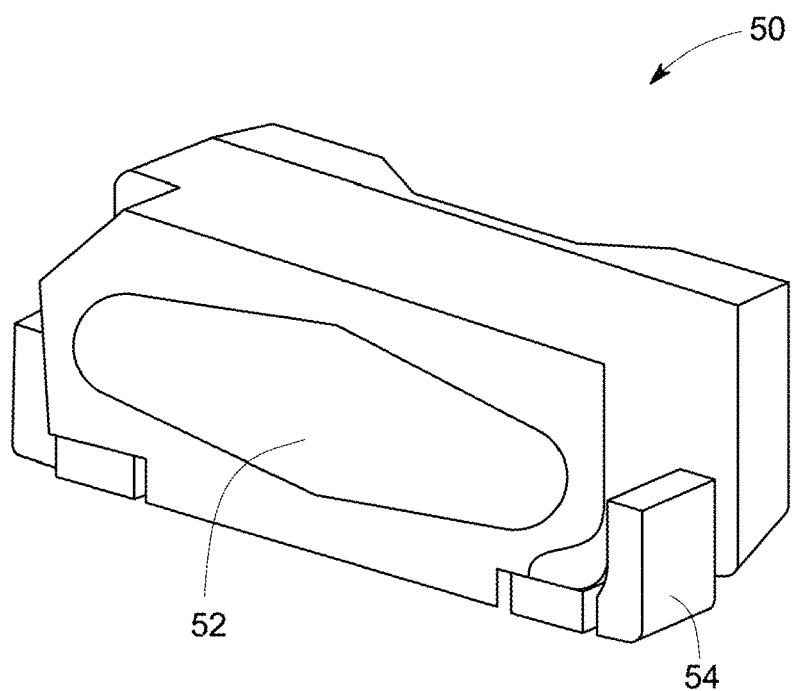
FIG. 2 is a schematic view of a surface-mounted device (SMD), in accordance with one embodiment of the present disclosure.

Some embodiments include a backlight apparatus that includes a surface mounted device (SMD) type light emitting diode 50, e.g. as illustrated in FIG. 2. This SMD is a "side-emitting type" and has a light-emitting window 52 on a protruding portion of a light guiding member 54. An SMD package may comprise an LED chip as defined above, and a phosphor composition including a population of the coated phosphor particles as described above.

By use of the phosphor compositions described herein in some embodiments, lighting apparatus can be provided producing red light or white light having high luminosity, and high CRI values for a low range of color temperatures of interest (2500 K to 4000 K) for general illumination.

Additional luminescent materials capable of emitting green, blue, yellow, red, orange, or other color radiation may be used in the phosphor composition (for example, a blend) or the lighting apparatus to customize the white color of the resulting light and produce specific spectral power distributions. In some embodiments, the additional luminescent material emits green radiation.

Suitable additional phosphors for use in the phosphor composition or the lighting apparatus include, but are not limited to:

$((Sr_{1-z}(Ca, Ba, Mg, Zn)_z)_{1-(x+w)}(Li, Na, K, Rb)_wCe_x)_3(Al_{1-y}Si_y)O_{4+y+(x-w)}F_{1-y-3(x-w)}$, $0<x\leq0.10$, $0\leq y\leq0.5$, $0\leq z\leq0.5$, $0\leq w\leq x$; $(Ca, Ce)_3Sc_2Si_3O_{12}(CaSiG)$; $(Sr,Ca,Ba)_3Al_{1-x}Si_xO_{4+x}F_{1-x}:Ce^{3+}$ (SASOF)); $(Ba,Sr,Ca)_5(PO_4)_3(Cl,F,Br,OH):Eu^{2+},Mn^{2+}$; $(Ba,Sr,Ca)BPO_5:Eu^{2+},Mn^{2+}$;

$(Sr,Ca)_{10}(PO_4)_6*vB_2O_3:Eu^{2+}$ (wherein $0<v\leq1$); $Sr_2Si_3O_8*2SrCl_2:Eu^{2+}$; $(Ca,Sr,Ba)_3MgSi_2O_8:Eu^{2+},Mn^{2+}$; $BaAl_8O_{13}:Eu^{2+}$;

$2SrO*0.84P_2O_5*0.16B_2O_3:Eu^{2+}$; $(Ba,Sr,Ca)MgAl_{10}O_{17}:Eu^{2+},Mn^{2+}$; $(Ba,Sr,Ca)Al_2O_4:Eu^{2+}$;

$(Y,Gd,Lu,Sc,La)BO_3:Ce^{3+},Tb^{3+}$; $ZnS:Cu^+,Cl^-$; $ZnS:Cu^+,Al^{3+}$; $ZnS:Ag^+,Cl^-$; $ZnS:Ag^+,Al^{3+}$;

$(Ba,Sr,Ca)_2Si_\xi O_{4-2\xi}:Eu^{2+}$ (wherein $-0.20\leq\xi\leq0.2$); $(Ba,Sr,Ca)_2(Mg,Zn)Si_2O_7:Eu^{2+}$;

$(Sr,Ca,Ba)(Al,Ga,In)_2S_4:Eu^{2+}$; $(Y,Gd,Tb,La,Sm,Pr,Lu)_3(Al,Ga)_{-\alpha}O_{12-3/2\alpha}:Ce^{3+}$ (wherein $0\leq\alpha\leq0.5$); $(Ca,Sr)_8(Mg,Zn)(SiO_4)_4Cl_2:Eu^{2+},Mn^{2+}$; $Na_2Gd_2B_2O_7:Ce^{3+},Tb^{3+}$;

$(Sr,Ca,Ba,Mg,Zn)_2P_2O_7:Eu^{2+},Mn^{2+}$; $(Gd,Y,Lu,La)_2O_3:Eu^{3+},Bi^{3+}$;

$(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+},Ce^{3+}$;

$SrY_2S_4:Eu^{2+}$; $CaLa_2S_4:Ce^{3+}$; $(Ba,Sr,Ca)MgP_2O_7:Eu^{2+},Mn^{2+}$; $(Y,Lu)_2WO_6:Eu^{3+},Mo^{6+}$;

$(Ba,Sr,Ca)_\beta Si_\gamma N_\mu:Eu^{2+}$ (wherein $2\beta+4\gamma=3\mu$); $(Ba,Sr,Ca)_2Si_{5-x}Al_xN_{6-x}O_x:Eu^{2+}$(wherein $0\leq x\leq2$); $Ca_3(SiO_4)Cl_2:Eu^{2+}$; $(Lu,Sc,Y,Tb)_{2-u-v}Ce_vCa_{1+u}Li_wMg_{2-w}P_w(Si,Ge)_{3-w}O_{12-u/2}$ (where $0.5\leq u\leq1$, $0\leq0.1$, and $0\leq w\leq0.2$); $(Y,Lu,Gd)_{2-\varphi}Ca_\varphi Si_4N_{6+\varphi}C_{1-\varphi}:Ce^{3+}$, (wherein $0\leq\varphi\leq0.5$);

(Lu,Ca,Li,Mg,Y), α-SiAlON doped with $Eu^{2+}$ and/or $Ce^{3+}$; $(Ca,Sr,Ba)SiO_2N_2:Eu^{2+},Ce^{3+}$;

β-SiAlON:$Eu^{2+}$, $3.5MgO*0.5MgF_2*GeO_2:Mn^{4+}$; $(Sr,Ca,Ba)AlSiN_3:Eu^{2+}$; $(Sr,Ca,Ba)_3SiO_5:Eu^{2+}$;

$Ca_{1-c-f}Ce_cEu_fAl_{1+c}S_{1-c}N_3$, (where $0\leq c\leq0.2$, $0\leq f\leq0.2$); $Ca_{1-h-r}Ce_hEu_rAl_{1-h}(Mg,Zn)_hSiN_3$, (where $0\leq h\leq0.2$, $0\leq r\leq0.2$); $Ca_{1-2s-t}Ce_s(Li,Na)_sEu_tAlSiN_3$, (where $0\leq s\leq0.2$, $0\leq f\leq0.2$, $s+t>0$); and $Ca_{1-\sigma-\chi-\phi}(Li,Na)_\chi Eu_\phi Al_{1+\sigma-\chi}Si_{1-\sigma+\chi}N_3$, (where $0\leq\sigma\leq0.2$, $0\leq\chi\leq0.4$, $0\leq\phi\leq0.2$).

Other additional luminescent materials suitable for use in the lighting apparatus include electroluminescent polymers such as polyfluorenes, preferably poly(9,9-dioctyl fluorene) and copolymers thereof, such as poly(9,9'-dioctylfluorene-co-bis-N,N'-(4-butylphenyl)diphenylamine) (F8-TFB); poly (vinylcarbazole) and polyphenylenevinylene and their derivatives. In addition, the phosphor composition may include a blue, yellow, orange, green or red phosphorescent dye or metal complex, or combinations thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorephenyl)pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

In some embodiments, the additional luminescent material includes a green light emitting quantum dot (QD) material. The green light emitting QD material may include a group II-VI compound, a group III-V compound, a group IV-IV compound, a group IV compound, a group I-III-VI$_2$ compound, or a mixture thereof. Non-limiting examples of group II-VI compounds include CdSe, CdTe, CdS, ZnSe, ZnTe, ZnS, HgTe, HgS, HgSe, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, or combinations thereof. Group III-V compounds may be selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs, and combinations thereof. Examples of group IV compounds include Si, Ge, SiC, and SiGe. Examples of group I-III-VI$_2$ chalcopyrite-type compounds include CuInS$_2$, CuInSe$_2$, CuGaS$_2$, CuGaSe$_2$, AgInS$_2$, AgInSe$_2$, AgGaS$_2$, AgGaSe$_2$ and combinations thereof.

QD materials for use as the additional luminescent material may be a core/shell QD, including a core, at least one shell coated on the core, and an outer coating including one or more ligands, preferably organic polymeric ligands. Exemplary materials for preparing core-shell QDs include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdSeZn, CdTe, HgS, HgSe, HgTe, BeS, BeSe, BeTe, MgS, MgSe, MnS, MnSe, GeS, GeSe, GeTe, SnS, SnSe, SnTe, PbO, PbS, PbSe, PbTe, CuF, CuCl, CuBr, CuI, Si$_3$N$_4$, Ge$_3$N$_4$, Al$_2$O$_3$, (Al, Ga, In)$_2$ (S, Se, Te)$_3$, Al$_2$CO, and appropriate combinations of two or more such materials. Exemplary core-shell QDs include, but are not limited to, CdSe/ZnS, CdSe/CdS, CdSe/CdS/ZnS, CdSeZn/CdS/ZnS, CdSeZn/ZnS, InP/ZnS, PbSe/PbS, PbSe/PbS, CdTe/CdS, and CdTe/ZnS.

The QD materials typically include ligands conjugated to, cooperated with, associated with, or attached to their surface. In particular, the QDs may include a coating layer comprising ligands to protect the QDs from environmental conditions including elevated temperatures, high intensity light, external gasses, and moisture, control aggregation, and allow for dispersion of the QDs in the host binder material.

The ratio of each of the individual luminescent material, for example coated phosphor particles and the additional luminescent materials may vary depending on the characteristics of the desired light output. The relative proportions of individual luminescent materials in a lighting apparatus may be adjusted such that when their emissions are blended and employed in the lighting apparatus, there is produced visible light of predetermined x and y values on the CIE chromaticity diagram created by the International Commission on Illumination (CIE). In certain embodiments, the lighting apparatus emits white light. The exact identity and amount of each luminescent material for use in a lighting apparatus can be varied according to the needs of the end user.

The lighting apparatus and/or backlight apparatus of the present disclosure may be used for general illumination and display applications. Examples include chromatic lamps, plasma screens, xenon excitation lamps, UV excitation marking systems, automotive headlamps, home and theatre projectors, laser pumped devices, point sensors, liquid crystal display backlight units, televisions, computer monitors, smartphones, tablet computers and other handheld devices that have a display including a semiconductor light source as described herein. The list of these applications is meant to be merely exemplary and not exhaustive

EXAMPLES

The examples that follow are merely illustrative, and should not be construed to be any sort of limitation on the scope of the claimed invention. Unless specified otherwise, all ingredients and components are commercially available from common chemical suppliers.

K$_2$SiF$_6$:Mn$^{4+}$ phosphor powder was synthesized according to a procedure described in the referenced U.S. Pat. No. 7,497,973 in a HF solution with a drying temperature of about 70 degrees Celsius. The synthesized K$_2$SiF$_6$:Mn$^{4+}$ phosphor powder was treated using a process as described in the referenced U.S. Pat. No. 8,906,724. The amount of manganese present in K$_2$SiF$_6$:Mn$^{4+}$ phosphor powder was about 10 mol %.

Example 1: Procedure for Coating Phosphor Particles Using ALD

A CambridgeNanotech Atomic Layer deposition (ALD) System was used for coating K$_2$SiF$_6$:Mn$^{4+}$ powder. K$_2$SiF$_6$:Mn$^{4+}$ powder (2 g) was spread on a Petri dish in the growth chamber of the ALD system after setting the growth chamber at about 100 degrees Celsius. Then the ALD system was pumped to about 1 Torr. The growth chamber was purged by flowing 20 slm (standard liter per minute) nitrogen. After about 15 minutes, following steps were performed repetitively to complete 500 cycles:
  (i) open a valve to supply an amount of trimethylaluminum (TMA) to the growth chamber for about 0.015 seconds and close the valve then;
  (ii) wait for about 5 seconds;
  (iii) Open another valve to supply water vapor to the growth chamber for about 0.015 seconds and close the valve; and
  (iv) wait for about 20 seconds
After performing 500 cycles, the growth chamber was vent to atmospheric pressure. The powder in the Petri dish was mixed by shaking it in a vial.
The above process was repeated 3 more times to perform total 2000 cycles. The resulting sample powder was then taken out of the ALD system.

The sample prepared in Example 1 and a baseline sample of uncoated phosphor powder were examined using Energy Dispersive X-ray Spectroscopy (EDS). In contrast to the baseline sample, the x-ray pattern of the sample of Example 1 showed the presense of Al and O contents on the surface of phosphor particles, which were consistent with Al$_2$O$_3$. The sample of Example 1 had higher oxygen content than that of the baseline sample. These results indicated that phosphor particles of the sample of Example 1 were coated with Al$_2$O$_3$ coating. Further, the sample of Example 1 was measured for quantum efficiency (QE) at excitation wavelength 450 nm by using a quantum efficiency measuring system. No significant change in QE (drop in QE) was observed for the sample of Example 1 after performing the ALD coating process.

While only certain features of the disclosure have been illustrated and described herein, many modifications and changes will occur to those skilled in the art. It is, therefore, to be understood that the appended claims are intended to cover all such modifications and changes as fall within the true spirit of the invention.

The invention claimed is:

1. A population of coated phosphor particles, each coated phosphor particle having a core comprising a $Mn^{4+}$ doped phosphor and a conformal coating shell formed from a plurality of alternating layers of two different vapor precursors via an atomic layer deposition (ALD) process, the shell comprising aluminum oxide, titanium oxide, zirconium oxide, zinc oxide, tin oxide, silicon dioxide, hafnium oxide, indium oxide, indium tin oxide, potassium fluoride, titanium nitride, boron nitride, silicon nitride, a polymer material, or a combination thereof.

2. The population of coated phosphor particles according to claim 1, wherein the $Mn^{4+}$ doped phosphor is a compound of formula I $$A_x (M, Mn)F_y \qquad (I)$$

wherein
A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
x is an absolute value of a charge of an $[MF_y]$ ion; and
y is 5, 6, or 7.

3. The population of coated phosphor particles according to claim 2, wherein A is Na, K, Rb, Cs, or a combination thereof; M is Si, Ge, Ti, or a combination thereof; and Y is 6.

4. The population of coated phosphor particles according to claim 2, wherein A is K and M is Si.

5. The population of coated phosphor particles according to claim 1, wherein the shell comprises aluminum oxide, titanium oxide, zirconium oxide, zinc oxide, tin oxide, silicon dioxide, hafnium oxide, indium oxide, indium tin oxide or a combination thereof.

6. The population of coated phosphor particles according to claim 1, wherein the shell comprises aluminum oxide.

7. The population of coated phosphor particles according to claim 1, wherein the shell has a thickness less than 200 nanometers.

8. The population of coated phosphor particles according to claim 1, wherein the shell has a thickness in a range from about 20 nanometers to about 150 nanometers.

9. The population of coated phosphor particles according to claim 1, wherein the population of coated phosphor particles has a particle size distribution having a D50 particle size in a range from about 0.1 micron to about 80.

10. A lighting apparatus comprising:
a semiconductor light source radiationally coupled to a population of coated phosphor particles in accordance with claim 1.

11. A backlight apparatus comprising:
a semiconductor light source radiationally coupled to a population of coated phosphor particles in accordance with claim 1.

12. The backlight apparatus according to claim 11, comprising a television.

13. A process for preparing a population of coated phosphor particles comprising:
exposing particles of a $Mn^{4+}$ doped phosphor alternately to a first precursor vapor and a second precursor vapor via an Atomic Layer Deposition (ALD) process to form a conformal coating shell on each particle, wherein the first precursor is different from the second precursor, and wherein the first precursor comprises an alkyl chloride and the second precursor comprises an alkylamine,
wherein the coating comprises aluminum oxide, titanium oxide, zirconium oxide, zinc oxide, tin oxide, silicon dioxide, hafnium oxide, indium oxide, indium tin oxide, potassium fluoride, titanium nitride, boron nitride, silicon nitride, a polymer material, or a combination thereof.

* * * * *